United States Patent
Watanabe et al.

(10) Patent No.: US 8,593,166 B2
(45) Date of Patent: Nov. 26, 2013

(54) SEMICONDUCTOR WAFER, SEMICONDUCTOR CIRCUIT, SUBSTRATE FOR TESTING AND TEST SYSTEM

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 177 days.

(21) Appl. No.: 12/957,168

(22) Filed: Nov. 30, 2010

(65) Prior Publication Data

US 2011/0148454 A1    Jun. 23, 2011

Related U.S. Application Data

(63) Continuation of application No. PCT/JP2008/060172, filed on Jun. 2, 2008.

(51) Int. Cl.
*G01R 31/26* (2006.01)

(52) U.S. Cl.
USPC .................................. 324/762.01

(58) Field of Classification Search
None
See application file for complete search history.

(56) References Cited

U.S. PATENT DOCUMENTS

| | | | | |
|---|---|---|---|---|
| 5,053,700 | A * | 10/1991 | Parrish | 324/537 |
| 5,070,297 | A * | 12/1991 | Kwon et al. | 324/754.03 |
| 5,225,834 | A * | 7/1993 | Imai et al. | 341/120 |
| 5,506,851 | A | 4/1996 | Fuse | |
| 5,994,912 | A * | 11/1999 | Whetsel | 324/754.03 |
| 6,313,655 | B1 * | 11/2001 | Krause | 324/750.3 |
| 7,328,387 | B2 * | 2/2008 | Whetsel | 714/726 |
| 7,417,450 | B2 * | 8/2008 | Whetsel | 324/750.3 |
| 7,895,486 | B2 * | 2/2011 | Siebert | 714/726 |
| 2001/0047496 | A1 | 11/2001 | Hidaka et al. | |
| 2004/0232930 | A1 | 11/2004 | Shibuya et al. | |
| 2006/0192575 | A1 | 8/2006 | Kasukabe et al. | |

FOREIGN PATENT DOCUMENTS

| | | |
|---|---|---|
| JP | 61-134034 A | 6/1986 |
| JP | 2-301150 A | 12/1990 |
| JP | 5-281304 A | 10/1993 |
| JP | 2001-338953 A | 12/2001 |
| JP | 2005-147679 A | 6/2005 |
| JP | 2005-340343 A | 12/2005 |
| KR | 10-2006-0028780 A | 4/2006 |
| WO | 2004/090561 A1 | 10/2004 |

OTHER PUBLICATIONS

Korean Office Action dated Oct. 24, 2011, in a counterpart Korean patent application No. 10-2010-7026135.
International Search Report (ISR) issued in PCT/JP2008/060172 (parent application) mailed in Aug. 2008 for Examiner consideration.
Written Opinion (PCT/ISA/237) issued in PCT/JP2008/060172 (parent application) mailed in Aug. 2008.
TW Office Action/ Search Report and English Translation Dated Mar. 21, 2013; Application No. 098118198.
JP Office Action/ Seach Report and Computer Translation Dated Apr. 23, 2013; Application No. 2010-515690.

* cited by examiner

*Primary Examiner* — Vinh Nguyen (57) ABSTRACT

A test system includes a test substrate that transmits/receives signals to/from a semiconductor wafer, and a control apparatus to control the test substrate. The semiconductor wafer includes an external terminal coupled to an external measurement circuit, a plurality of selecting wiring lines provided to receive/transmit signals to/from the corresponding the measuring points, and a selecting section that selects one of the selecting wiring lines and that allows signal transmission between the corresponding measuring point and the external terminal through the selected selecting wiring line. The test substrate includes a measurement circuit that is coupled to the external terminal of the semiconductor wafer and that measures an electrical characteristic of a signal transmitted through the selecting wiring line selected by the selecting section, and a control section that controls which one of the measurement wiring lines is to be selected by the selecting section in the semiconductor wafer.

9 Claims, 9 Drawing Sheets

FIG. 9

SEMICONDUCTOR WAFER, SEMICONDUCTOR CIRCUIT, SUBSTRATE FOR TESTING AND TEST SYSTEM

BACKGROUND

1. Technical Field

The present invention relates to a semiconductor wafer, a test substrate and a test system. The preset invention relates to, in particular, a semiconductor wafer in which a plurality of semiconductor circuits are formed, a substrate for testing the plurality of semiconductor circuits formed on the semiconductor wafer, and a test system thereof.

2. Related Art

In testing of measurement circuits such as semiconductor circuits, to judge pass/fail of the measurement circuits, measurements of signals output by the measurement circuits are conducted. For example, a test apparatus judges pass/fail of a measurement circuit based on characteristics of a signal output by the measurement circuit, such that the output signal has a predetermined logical pattern, a certain electrical property and so forth.

A test module in which test circuits are fabricated is typically coupled to measurement circuits through cables, connectors, a substrate and so forth, as described, for example, in WO2004/090561. Therefore, the test apparatus needs an element provided thereof, that has a driving capability corresponding to parasitic capacitance caused by the cable, the connector, the substrate and so forth, in order to measure signals accurately. For example, the test apparatus can measure a signal output by a driver which is disposed at an output end of a measurement circuit, with a relatively high accuracy. However, signals at nodes inside the measurement circuit cannot be accurately measured.

To address such problem, test circuits may be disposed close to the measurement circuits so that a signal transmission distance between the measurement circuits and the test circuits can be shortened. In addition, internal nodes in a measurement circuit may be connected to measurement terminals thereby signals at the internal nodes in the measurement circuit can be accurately measured. Such measurement terminal may be provided so as to correspond to each internal node that is to be measured, and signals at various nodes in the measurement circuit can be measured.

The measurement terminals facilitate an electrical connection with an external measuring device. However, they occupy a substantial area. Therefore, it is not preferable to provide a large number of the measurement terminals in the measurement circuit, which could reduce an area where actual operation circuits are to be formed.

SUMMARY

Therefore, it is an object of an aspect of the innovations herein to provide a semiconductor wafer, a substrate for testing and a test system, which are capable of overcoming the above drawback accompanying the related art. The above and other objects can be achieved by combinations described in the claims. According to a first aspect of the innovations, a semiconductor wafer in which a plurality of semiconductor circuits are formed includes an external terminal coupled to an external measurement circuit, a plurality of selecting wiring lines provided so as to correspond to a plurality of measuring points in the semiconductor wafer and so as to receive and transmit signals to/from the corresponding the measuring points, and a selecting section that selects one of the selecting wiring lines, and that allows signal transmission between the corresponding measuring point and the external terminal through the selected selecting wiring line.

According to a second aspect of the innovations, a semiconductor circuit having an operation circuit includes an external terminal coupled to an external measurement circuit, a plurality of selecting wiring lines provided so as to correspond to a plurality of measuring points in the operation circuit and so as to receive and transmit signals to/from the corresponding the measuring points, and a selecting section that selects one of the selecting wiring lines, and that allows signal transmission between the corresponding measuring point and the external terminal through the selected selecting wiring line.

According to a third aspect of the innovations, a test substrate for testing a plurality of semiconductor circuits formed in a semiconductor wafer is provided. The semiconductor wafer includes an external terminal coupled to an external measurement circuit, a plurality of selecting wiring lines provided so as to correspond to a plurality of measuring points in the semiconductor wafer and so as to receive and transmit signals to/from the corresponding the measuring points, and a selecting section that selects one of the selecting wiring lines, and that allows signal transmission between the corresponding measuring point and the external terminal through the selected selecting wiring line. The test substrate includes a measurement circuit that is coupled to the external terminal of the semiconductor wafer, and that measures an electrical characteristic of a signal transmitted through the selecting wiring line selected by the selecting section, and a control section that controls which one of the measurement wiring lines is to be selected by the selecting section in the semiconductor wafer.

According to a fourth aspect of the innovations, a test system for testing a plurality of semiconductor circuits formed in a semiconductor wafer is provided. The test system includes a test substrate provided so as to transmit and receive signals to/from the semiconductor wafer, and a control apparatus to control the test substrate. The semiconductor wafer includes an external terminal coupled to an external measurement circuit, a plurality of selecting wiring lines provided so as to correspond to a plurality of measuring points in the semiconductor wafer and so as to receive and transmit signals to/from the corresponding the measuring points, and a selecting section that selects one of the selecting wiring lines, and that allows signal transmission between the corresponding measuring point and the external terminal through the selected selecting wiring line. The test substrate includes a measurement circuit that is coupled to the external terminal of the semiconductor wafer, and that measures an electrical characteristic of a signal transmitted through the selecting wiring line selected by the selecting section, and a control section that controls which one of the measurement wiring lines is to be selected by the selecting section in the semiconductor wafer.

The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
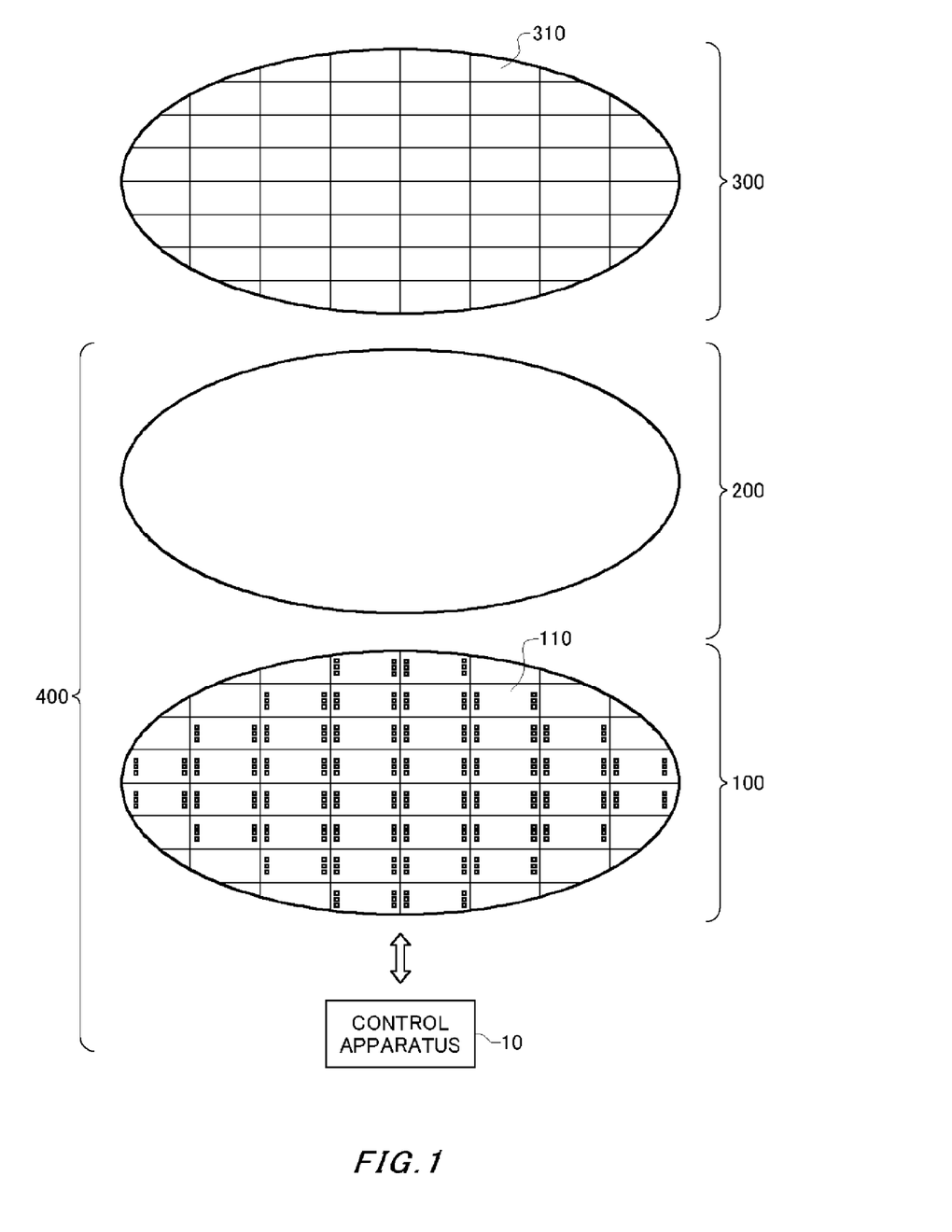
FIG. 1 shows an example of a test system 400.

FIG. 1 shows an example of a test system 400. The test system 400 tests a plurality of semiconductor circuits 310 formed in a semiconductor wafer 300. The semiconductor wafer 300 may be a silicon wafer, and the plurality of semiconductor circuits 310 are formed in the semiconductor wafer 300 by semiconductor process including exposure and so forth.

In this example, the test system 400 tests the semiconductor circuits 310 concurrently. The test system 400 includes a probe card 200, a test substrate 100 and a control apparatus 10.

The probe card 200 is provided between the semiconductor wafer 300 and the test substrate 100, and exchange signals between the semiconductor wafer 300 and the test substrate 100. The probe card 200 in the example may be electrically coupled to the semiconductor wafer 300 and the test substrate 100. In a following example, signals are transmitted and received between circuits and so forth through electric signal transmission lines. However, signals can be transmitted and received between the circuits through an electrostatic coupling, an inductive coupling, an optical coupling or the like.

The probe card 200 may electrically couple the plurality of semiconductor circuits 310 in the semiconductor wafer 300 collectively to the test substrate 100. The probe card 200, in this example, may have a diameter which is substantially same as the semiconductor wafer 300. The probe card 200 may be formed of the same material as the semiconductor wafer 300.

Pads electrically coupling the semiconductor wafer 300 and the test substrate 100 may be formed respectively on a front face and a back face of the probe card 200. Furthermore, via-holes may also be provided in the probe card 200, and the pads formed on the front face can be electrically coupled to the pads formed on the back face through the via-hole. An interval of the pads formed on the front face may be different from an interval of the pads formed on the back face of the prove card 200.

The test substrate 100 is electrically coupled to the plurality of the semiconductor circuits 310 in the semiconductor wafer 310 via the probe card 200. For example, the semiconductor wafer 300, the probe card 200 and the test substrate 100 may be stacked together to form layers, and the semiconductor wafer 300 can be electrically coupled to the test substrate 100 via the probe card 200. More specifically, a pad of the semiconductor wafer 300 is electrically connected to the pad on the front face of the probe card 200, a pad of the test substrate 100 is electrically connected to the pad on the back face of the probe card 200, and thereby the test substrate 100 is electrically coupled to the semiconductor wafer 300.

The probe card 200 may be a flexible substrate such as an anisotropically-conductive sheet and a membrane sheet with bumps. Alternatively, the probe card 200 may be a substrate which transmits signals in a contactless manner between the pad of the semiconductor wafer 300 and the pad of the test substrate 100 as described above. For example, the probe card 200 may transmit signal between the pad of the semiconductor wafer 300 and the pad of the test substrate 100 through an electrostatic coupling, an inductive coupling, an optical coupling or the like.

The test substrate 100 has a plurality of test circuits 110. The plurality of test circuits 110 each correspond to different one of the semiconductor circuits 310 on one-on-one basis, and each test circuit 110 is electrically coupled to the corresponding semiconductor circuit 310 via the probe card 200. Each test circuit 110 tests the corresponding semiconductor circuit 310.

Each test circuit 110 may judge pass or fail of the corresponding semiconductor circuit 310 based on a signal received from the corresponding semiconductor circuit 310. For example, the test circuit 110 may determine whether a logical pattern of the signal output by the semiconductor circuit 310 matches with a prescribed expected pattern or not. Alternatively, the test circuit 110 may judge whether an electrical characteristic of the signal output by the semiconductor circuit 310 satisfies a prescribed specification or not. The test circuit 110 may loop-back the output signal of the semiconductor circuit 310 to the semiconductor circuit 310 in order to perform a loop-back test of the semiconductor circuit 310.

The control apparatus 10 controls the test substrate 100. The control apparatus 10 may control the plurality of test circuits 110. For instance, the control apparatus 10 may supply, to each of the test circuits 110, with an operation start signal, a clock signal and so forth with which the plurality of test circuits 110 are synchronized.

The test substrate 100 may have a diameter which is substantially the same as the semiconductor wafer 300. The test substrate 100 may be formed of the same material as the semiconductor wafer 300. In this case, the plurality of the test circuits 110 may be formed in the test substrate 100 by semiconductor process such as exposure. The test substrate 100 may be a printed circuit board. In this case, circuit chips each having the test circuits 110 may be mounted on the printed circuit board.

In this way, the test circuits 110 which test the corresponding semiconductor circuits 310 are provided in the test substrate 100 that is disposed close to the semiconductor wafer 300, thereby it is possible to realize short transmission paths between the semiconductor circuits 310 and the test circuits 110. Consequently, the semiconductor circuits 310 and the test circuits 110 can exchange signals by using drivers that have a relatively small driving capability or without using a driver.

Figure 2:
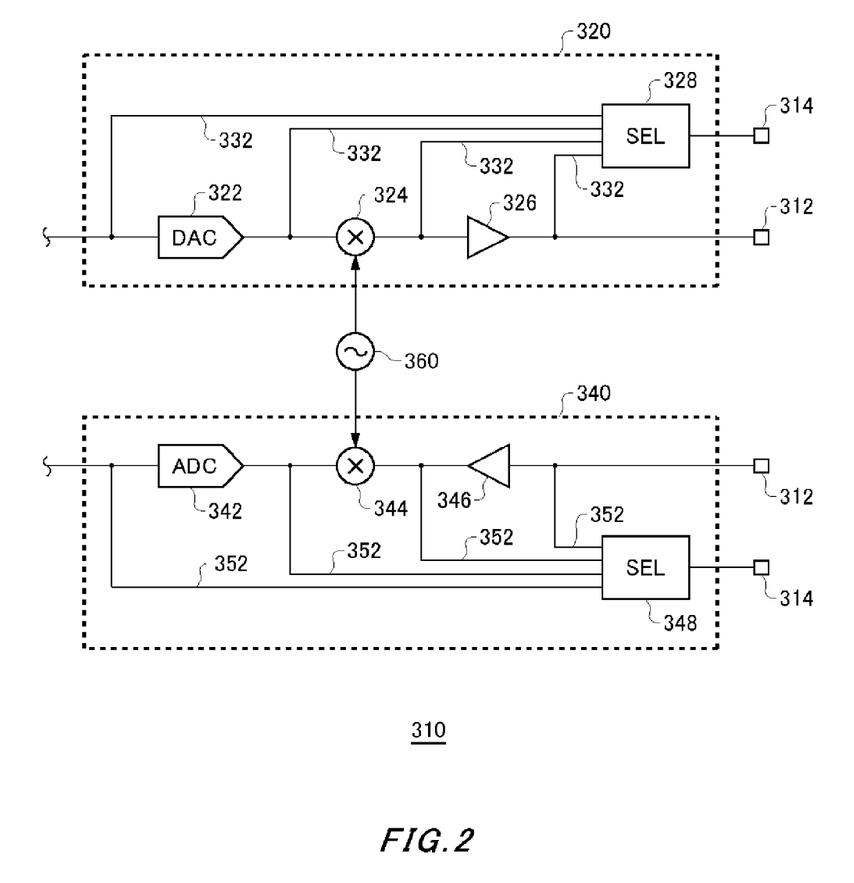
FIG. 2 shows a configuration example of a semiconductor circuit 310 formed in a semiconductor wafer 300.

FIG. 2 shows a configuration example of the semiconductor circuit 310 formed in the semiconductor wafer 300. Circuit configuration of the semiconductor circuit 310 is not limited to the one shown in FIG. 2. Various circuit configurations are possible for the semiconductor circuit 310. The semiconductor circuits 310 may have the identical circuit configuration.

The semiconductor circuit 310 in this example may be a semiconductor chip that is used in, for example, a communication device, and that includes a local oscillator 360, a transmitting-side circuit 320 and a receiving-side circuit 340. A plurality of external terminals which are to be coupled electrically to external equipment is provided in the semiconductor circuit 310. For example, the semiconductor circuit 310 includes an actual operation terminal 312 and a measurement terminal 314 as the external terminals. When the semiconductor circuit 310 is mounted on a communication device, the actual operation terminal 312 may become a terminal that is electrically coupled to another circuit within the communication device. The measurement terminal 314 may also be a terminal that is electrically coupled to the test circuit 110 outside when the semiconductor circuit 310 is tested. When the semiconductor circuit 310 is mounted on a communication device, the measurement terminal 314 may be a terminal that is not electrically coupled to other circuits in the communication device.

The transmitting-side circuit 320 outputs a transmission signal which is to be transmitted from a communication device or the like. In this example, the transmitting-side circuit 320 includes a D/A converter 322, a mixer 324, a driver 326, a plurality of measurement wiring lines 332, and a selecting section 328. The plurality of measurement wiring lines 332 is one example of selecting wiring lines.

The D/A converter 322 converts a supplied digital signal into an analog signal. For example, the D/A converter 322 may receive a digital signal that indicates a logical pattern which a transmission signal should have.

The mixer 324 multiplies an analog signal output by the D/A converter 322 by a local signal output by the local oscillator 360. In other words, the mixer 324 shifts a frequency of the analog signal according to a frequency of the local signal. The driver 326 supplies a signal output by the mixer 324 to the actual operation terminal 312. The driver 326 may be an electric power amplifier which can output a prescribed range of power. The transmitting-side circuit 320 may further include a filter after the mixer 324. With such configuration, the transmitting-side circuit 320 generates a transmission signal.

The plurality of measurement wiring lines 332 are provided so as to correspond to a plurality of measuring points in each of the semiconductor circuits 310 provided in the semiconductor wafer 300, and the measurement wiring lines 332 each can send and receive signals to and from the corresponding measuring points. Each measurement wiring line 332 in this example is electrically coupled to the corresponding measuring point. In the transmitting-side circuit 320, one ends of the measurement wiring lines 332 are respectively coupled to, for example, an input terminal of the D/A converter 322, an output terminal of the D/A converter 322, an output terminal of the mixer 324 and an output terminal of the driver 326.

The selecting section 328 selects one of the measurement wiring lines 332 to allow signals are transmitted between corresponding measuring points and a corresponding external terminal through the selected measurement wiring lines 332. The selecting section 328 in this example electrically couples the selected measurement wiring line 332 to the measurement terminal 314. The selecting section 328 may select the measurement wiring line 332 in response to a control signal supplied by the corresponding test circuit 110. The semiconductor circuit 310 may further include, as one of the external terminals, a control terminal that receives the control signal from the test circuit 110.

Since the test circuit 110 is disposed close to the semiconductor circuit 310 as described above, the measurement wiring lines 332 are coupled to the measuring points inside the transmitting-side circuit 320, and signals at the measuring points can be measured without providing a driver and the like. Moreover, since the measurement wiring lines 332 are coupled to the plurality of the measuring points inside the transmitting-side circuit 320, it is possible to measure signals transmitted at the measuring points in the transmitting-side circuit 320. Consequently, it is possible to improve observability of the transmitting-side circuit 320 and thereby possible to measure characteristics of the transmitting-side circuit 320 more precisely.

Moreover, by providing the selecting section 328, the signals at the measuring points can be measured through the measurement terminals 314 the number of which is smaller than the number of the measuring points. Consequently, it is possible to reduce the area which the measurement terminals 314 occupy in the semiconductor circuit 310.

The selecting section 328 may be a circuit of which transmission property between its output and input is linear. For example, the selecting section 328 may be a circuit having a plurality of gate transistors or a plurality of transfer gates for passing selected analog signals between the output and the input.

In the same manner, a plurality of measurement wiring lines 352 may be coupled to a plurality of measuring points in the receiving-side circuit 340. The receiving-side circuit 340, in this example, includes an A/D converter 342, a mixer 344, a low-noise amplifier 346, a plurality of measurement wiring lines 352 and a selecting section 348. The measurement wiring lines 352 is one example of the selecting wiring lines.

The low-noise amplifier 346 receives a signal from an external circuit via the actual operation terminal 312. The low-noise amplifier 346 outputs a signal corresponding to the received signal. The mixer 344 multiplies a signal output by the low-noise amplifier 346 and a signal output by the local oscillator 360, and outputs the resulting signal. The A/D converter 342 receives an analog signal from the local oscillator 360 and converts it to a digital signal. The receiving-side circuit 340 may further include a filter after the mixer 344.

The plurality of measurement wiring lines 352 are provided so as to correspond to the plurality of measuring points in each semiconductor circuit 310 in the semiconductor wafer 300, and each electrically coupled to the corresponding measuring points. For example, in the receiving-side circuit 340, one ends of the measurement wiring lines 352 are electrically coupled to, an input terminal of the A/D converter 342, an output terminal of the A/D converter 342, an output terminal of the mixer 344 and an output terminal of the low-noise amplifier 346 respectively.

The selecting section 348 selects one of the measurement wiring lines 352 and electrically couples the selected one to the measurement terminal 314. The selecting section 348 may select the measurement wiring lines 352 depending on a control signal supplied by the corresponding test circuit 110. The semiconductor circuit 310 may further include a control terminal which receives the control signal from the test circuit 110. With such configuration, in the same manner as the transmitting-side circuit 320, signals at the plurality of measuring points can be measured in the receiving-side circuit 340.

The selecting section 328 and the selecting section 348 may receive signals supplied by an external circuit through the measurement terminals 314, and may apply the received signals to the measuring points. For example, a signal at any one of the measuring points in the transmitting-side circuit 320 can be supplied to one of the measuring points in the receiving-side circuit 340, and in this way, a loop-back test can be performed. In this case, the test circuit 110 may perform a predetermined signal processing onto the signal retrieved from the transmitting-side circuit 320 and then loop back the signal to the receiving-side circuit 350.

Moreover, when the loop-back test is conducted, the selecting section 328 and the selecting section 348 may respectively select corresponding measuring points in a pair of circuits in the semiconductor circuit 310. Here, the corresponding measuring points may be measuring points at which the transmission signals have a common characteristic. Characteristics of the transmission signal may include signal types of analog/digital, a frequency, a signal level and so forth.

For example, when the selecting section 328 selects a measuring point at the output terminal of the D/A converter 322, a signal transmitted at the measuring point is an analog signal of a base band. In this case, the selecting section 348 may select, as a measuring point, the input terminal of the A/D converter 342 at which the analog signal of the base band is transmitted. In order to allow the selecting section 328 and the selecting section 348 to select such measuring points, the test circuit 110 may supply control signals to the selecting sections 328, 348. With such control, it is possible to perform various loop-back tests in the semiconductor circuit 310.

Moreover, by providing the plurality of measurement wiring lines, the external terminals and the selecting sections in each of the semiconductor circuits 310, it is possible to perform detailed measurements and tests of each semiconductor circuit 310. The test circuit 110 may be electrically coupled to the semiconductor circuit 310 through the actual operation terminals 312. In this case, the semiconductor circuit 310 does not have the measurement terminals 314, instead, the selecting sections 328, 348 select which measuring points to be coupled to the test circuit 110 via the actual operation terminals 312.

Figure 3:
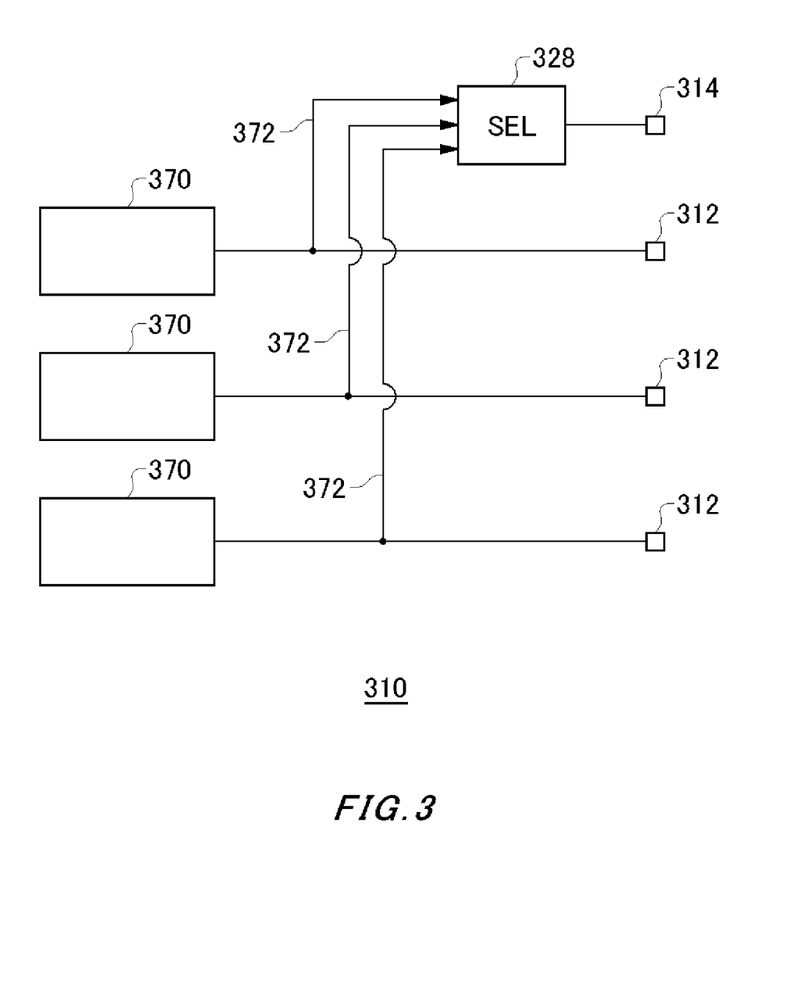
FIG. 3 shows another configuration example of the semiconductor circuit 310.

FIG. 3 shows another configuration example of the semiconductor circuit 310. The semiconductor circuit 310 of this example has a plurality of operation circuits 370, a plurality of measurement wiring lines 372, the plurality of actual operation terminals 312, the selecting section 328 and the measurement terminal 314. Here, the plurality of measurement wiring lines 372 is one example of the selecting wiring lines.

The plurality of operation circuits 370 may be circuits that operate when the semiconductor circuit 310 is implemented. The operation circuits 370 each correspond to different one of the actual operation terminals 312. Each operation circuit 370 is electrically coupled to an external circuit through the corresponding actual operation terminal 312.

The measurement wiring lines 372 each correspond to a different one of the operation circuits 370. Each measurement wiring line 372 measures an input/output terminal of the corresponding operation circuit 370, and electrically couples the measuring point to the selecting section 328.

The selecting section 328 selects one of the measurement wiring lines 372. The selecting section 328 electrically couples the selected measurement wiring line 372 to the measurement terminal 314. In such configuration, it is possible to measure signals transmitted through the input/output terminals of the plurality of the operation circuits 370 with one measurement terminal 314.

Each measurement wiring line and selecting section may be capable of bi-directional signal transmission in a direction from the measuring node in the semiconductor circuit 310 toward the external terminal and in a direction from the external terminal toward the measuring node. For example, the selecting section 328 and the measurement wiring lines 372 shown in FIG. 3 can transmit signals bi-directionally.

Alternatively, each measurement wiring line and selecting section may be capable of transmitting signals only in one of the above-mentioned two directions. For example, the measurement wiring lines 332 and the selecting section 328 shown in FIG. 2 may be capable of transmitting signals from the measuring node to the external terminal. Moreover, the measurement wiring lines 352 and the selecting section 328 shown in FIG. 2 may be capable of transmitting signals from the external terminal to the measuring node.

As described above, the semiconductor circuit 310 may have the measurement wiring lines and the selecting section that are capable of bi-directional signal transmission. In another example, the semiconductor circuit 310 may have the measurement wiring lines and the selecting section that transmit signals in one direction of the above-mentioned two directions.

Figure 4:
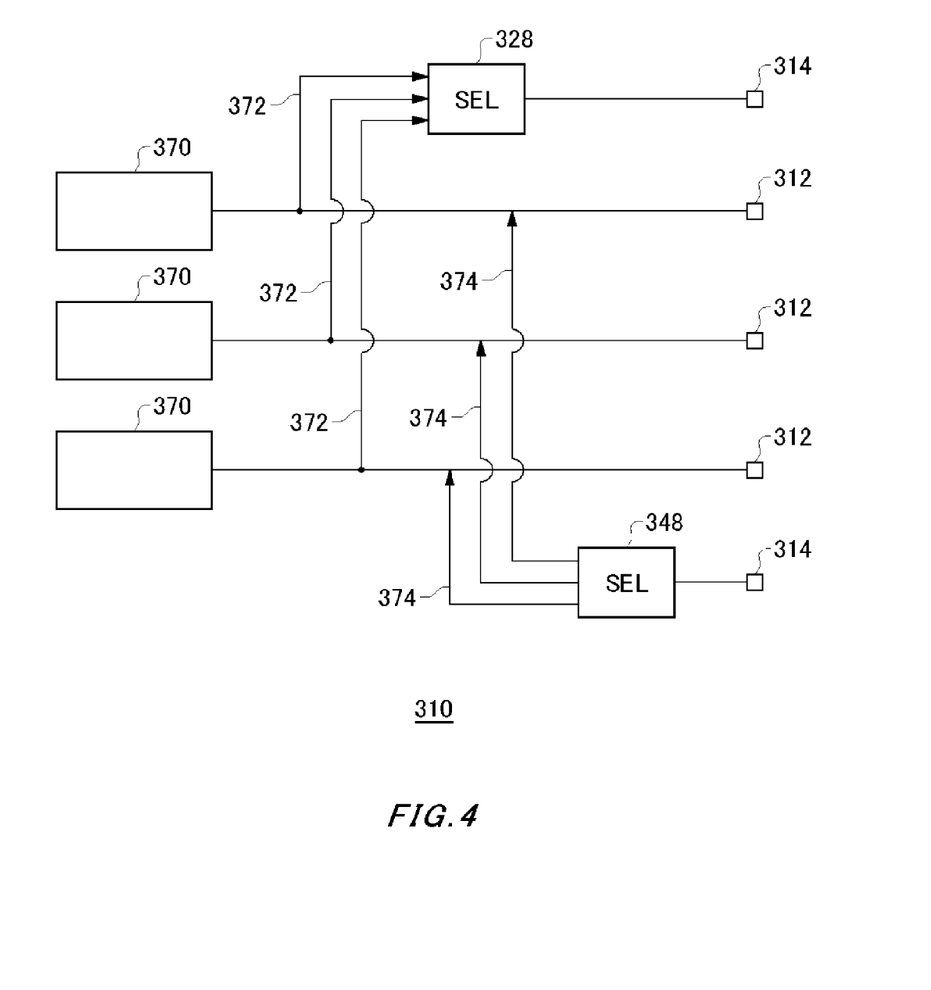
FIG. 4 shows another configuration example of the semiconductor circuit 310.

FIG. 4 shows another configuration example of the semiconductor circuit 310. The semiconductor circuit 310 in this example further includes a plurality of application wiring lines 374, a selecting section 348 and the measurement terminal 314, in addition to the above-mentioned elements of the semiconductor circuit 310 described with reference to FIG. 3. The plurality of application wiring lines 374 is one example of the selecting wiring lines.

The application wiring lines 374 each correspond to different one of the operation circuits 370. Each application wiring line 374 electrically couples the selecting section 348 to each measuring point which is an input/output terminal of the corresponding operation circuit 370.

The selecting section 348 selects one of the measurement wiring lines 372. The selecting section 348 further couples the selected measurement wiring line 372 electrically to the measurement terminal 314 that is different from the one coupled to the selecting section 328. The selecting section 348 receives a signal from the test circuit 110 via the measurement terminal 314, and supplies it to the operation circuit 370 through the selected measurement wiring line 372. With such configuration, a signal output by a given operation circuit 370 can be transmitted to the test circuit, a predetermined signal processing is performed on the signal in the test circuit 110, and the signal is then loop-backed to the given operation circuit 370.

Figure 5:
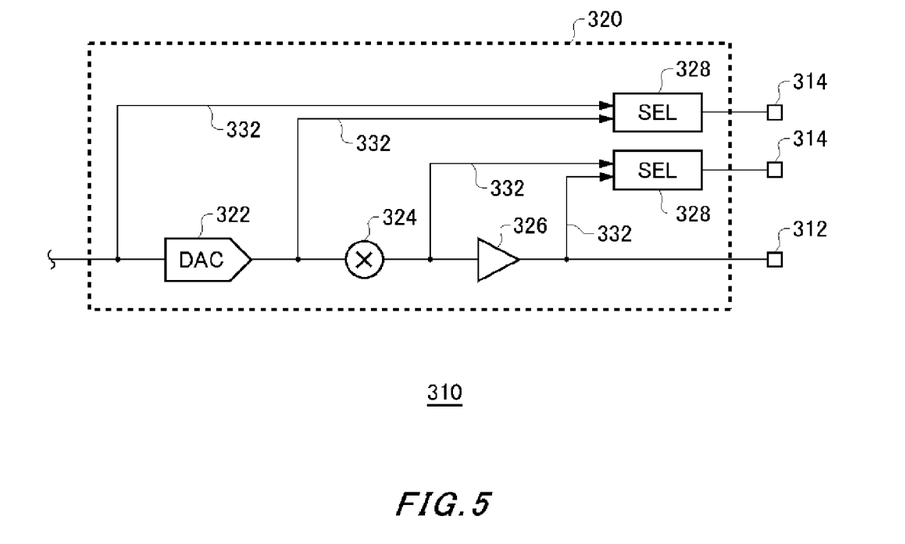
FIG. 5 shows another configuration example of the semiconductor circuit 310.

FIG. 5 shows another configuration example of the semiconductor circuit 310. Though only the transmitting-side circuit 320 is illustrated in FIG. 5, the receiving-side circuit 340 may also have the same configuration. The transmitting-side circuit 320 has the same configuration as one shown in FIG. 2, except for the selecting section 328 which is provided in a plural number in this example. Other elements in the circuit may be same as those in the transmitting-side circuit 320 described with reference to FIG. 2. The semiconductor circuit 310 may further include more than one measurement terminals 314 corresponding to the number of the selecting sections 328.

Each selecting section 328 is electrically coupled to the measurement wiring lines 332. Each selecting section 328 may be coupled to a different type of the measurement wiring lines 332. The types of the measurement wiring lines 332 coupled to the same selecting section 328 may partially overlap each other.

Each selecting section 328 may select one of the corresponding measurement wiring lines 332, and electrically couples the selected one to the test circuit 110 through the corresponding measurement terminal 314. With such configuration, signals at the plurality of the measuring points in the semiconductor circuit 310 can be simultaneously observed.

Figure 6:
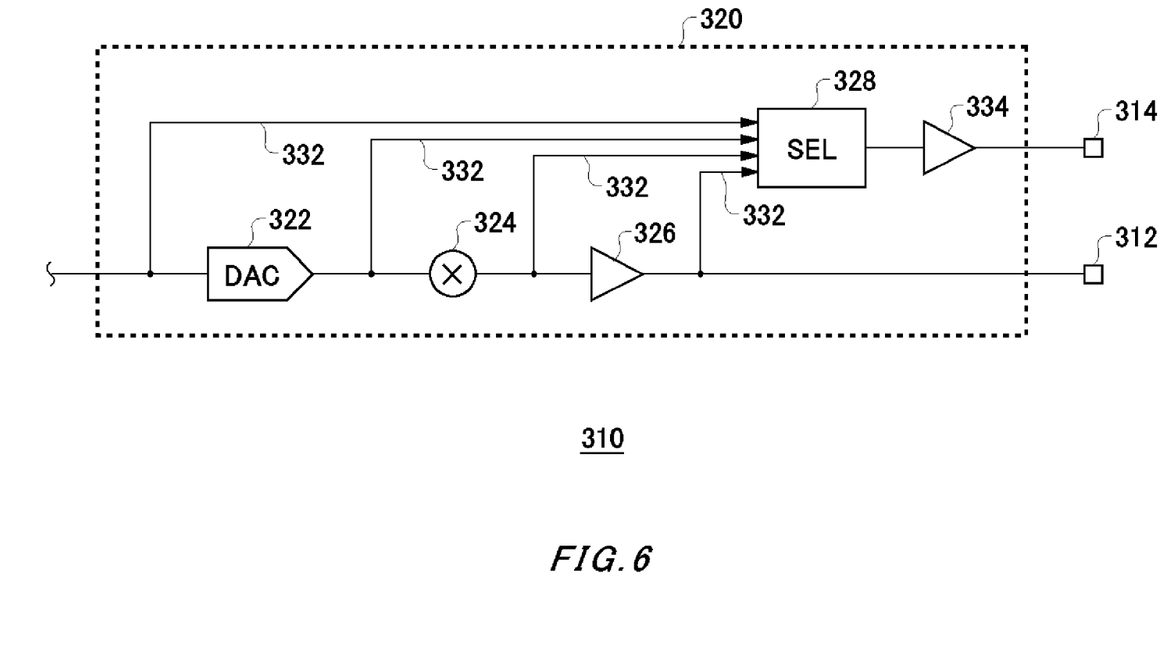
FIG. 6 shows another configuration example of the semiconductor circuit 310.

FIG. 6 shows another configuration example of the semiconductor circuit 310. Though only the transmitting-side circuit 320 is illustrated in FIG. 6, the receiving-side circuit 340 may also have the same configuration. The transmitting-side circuit 320 has the same configuration as one shown in FIG. 2, except for a measurement driver 334. Other elements in the circuit may be same as those in the transmitting-side circuit 320 described with reference to FIG. 2.

In the semiconductor circuit 310 described with reference to FIGS. 1-5, the measuring points are electrically coupled to the measurement terminal 314 without a driver circuit interposed therebetween, whereas in the semiconductor circuit 310 of this example, the measuring point is electrically coupled to the measurement terminal 314 via the measurement driver 334. The measurement driver 334 may be provided between the selecting section 328 and the measurement terminal 314. The measurement driver 334 outputs a voltage corresponding to a voltage supplied from the measurement wiring line 332 selected by the selecting section 328.

As described above, the test circuit 110 is disposed close to the semiconductor circuit 310. Thereby capacity and the like of the transmission lines which the measurement driver 334 has to drive are relatively small. Accordingly, the measurement driver 334 may be a driver of which output current is relatively small. For example, a current level which the measurement driver 334 is capable of outputting may be smaller than a current level which the driver 326 is capable of outputting, the driver 326 is provided in the semiconductor circuit 310 in order to output a signal to the outside.

The measurement driver 334 may have a linear transmission property between input and output. For example, the measurement driver 334 may be a linear amplifier. With such driver, it is possible to measure analog signals outside the circuit.

Figure 7:
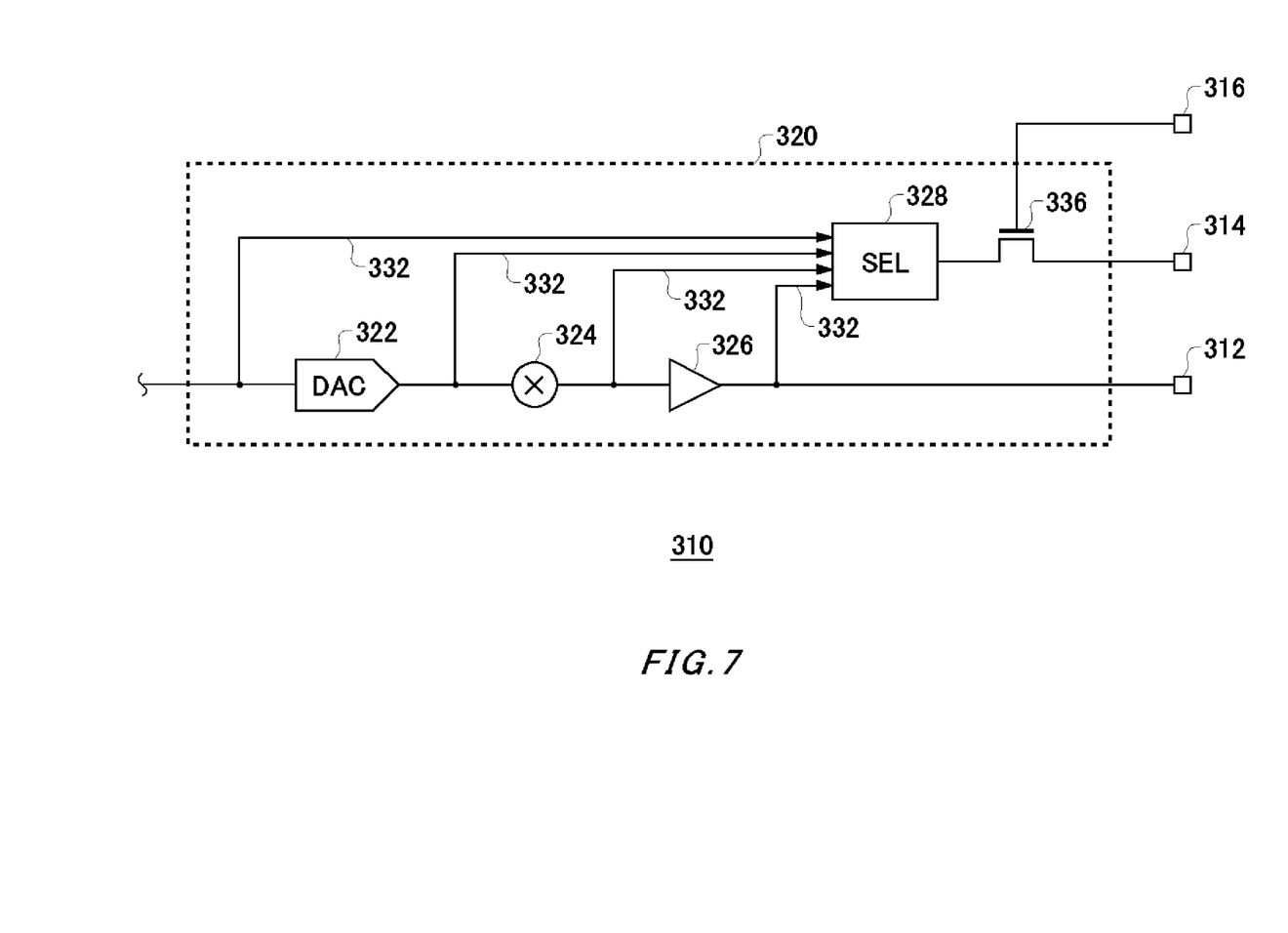
FIG. 7 shows another configuration example of the semiconductor circuit 310.

FIG. 7 shows another configuration example of the semiconductor circuit 310. Though only the transmitting-side circuit 320 is illustrated in FIG. 7, the receiving-side circuit 340 may also have the same configuration. The transmitting-side circuit 320 has the same configuration as one shown in FIG. 2, except for a switch 336. Other elements in the circuit may be same as those in the transmitting-side circuit 320 described with reference to FIG. 2. The semiconductor circuit 310 further includes a control terminal 316 as the external terminal.

The switch 336 is provided between the selecting section 328 and the measurement terminal 314, and switches whether to pass a signal through the transmission path between the selector 328 and the measurement terminal 314. The switch 336 in this example switches whether the selecting section 328 is electrically coupled to the measurement terminal 314 or not. The switch 336 switches whether the selecting section 328 is electrically coupled to the measurement terminal 314 or not, depending on a switching signal supplied by the test circuit via the control terminal 316.

The switch 336 may be a semiconductor switch. The switch 336 may be a switch which is turned off when the switch signal is not supplied and is turned on when the switch signal is supplied. In other words, the switch 336 is fixed to an off state when the semiconductor circuit 310 is actually mounted or packaged. In this way, it is possible to prevent noise from the measurement terminal 314 from being applied to the transmitting-side circuit 320 when the semiconductor circuit 310 is mounted or implemented.

Figure 8:
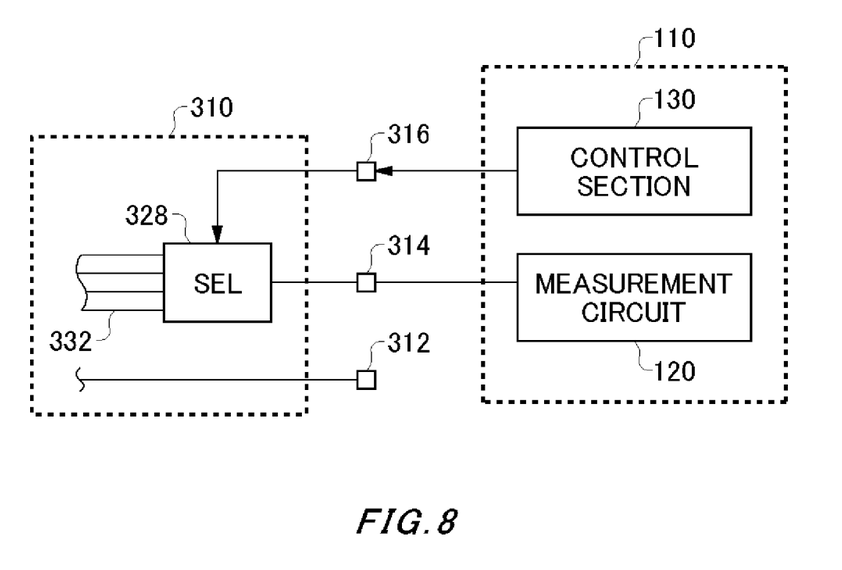
FIG. 8 shows a configuration example of each test circuit 110 provided in a test substrate 100.

FIG. 8 shows a configuration example of each test circuit 110 provided in the test substrate 100. FIG. 8 illustrates only one test circuit 110. However, the plurality of the test circuits 110 may have the identical configuration.

Each test circuit 110 has a control section 130 and a measurement circuit 120. The control section 130 is electrically coupled to the control terminal 316 of the semiconductor circuit 310. The measurement circuit 120 is electrically coupled to the measurement terminal 314 of the semiconductor circuit 310.

The control section 130 supplies the control signal to the selecting section 328 through the control terminal 316, and controls the selecting section 328 such that which one of the measurement wiring lines 332 the selecting section 328 selects depending on the supplied control signal. The measurement circuit 120 receives, via the measurement terminal 314, the signal transmitted through the measurement wiring line 332 that is selected by the selecting section 328. The measurement circuit 120 may judges pass or fail of the semiconductor circuit 310 by measuring electrical characteristics of the received signal.

In this way, the test substrate 100 can measure signals transmitted at various measuring points in the semiconductor circuit 310. Therefore, it is possible to test the semiconductor circuit 310 with a high accuracy.

The test circuit 110 may further include a signal processing section that receives a signal from the transmitting-side circuit 320 in the semiconductor circuit 310, performs a predetermined signal processing on the received signal, and loop-backs the processed signal to the receiving-side circuit 340. The signal processing section may loop-back, to the receiving-side circuit 340, the signal that has passed through, for example, a filter, a delay circuit, a noise generating circuit, a jitter generating circuit, a modulation circuit and so forth.

Figure 9:
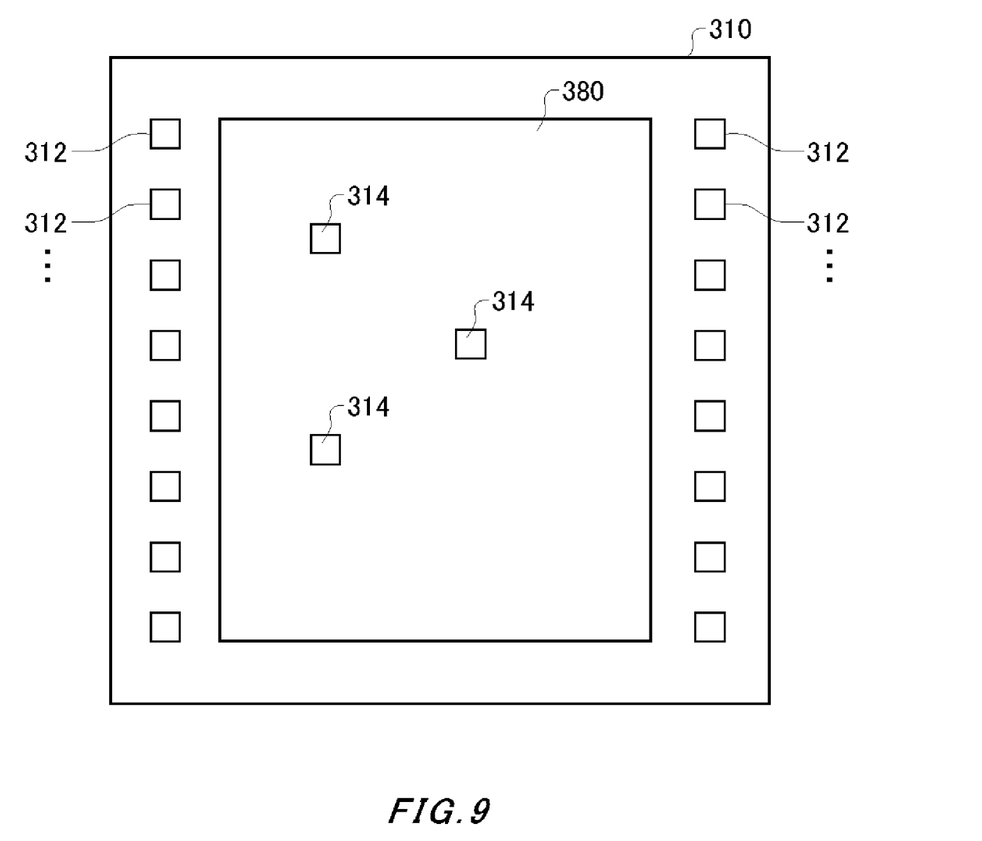
FIG. 9 illustrates an exemplary arrangement of measurement terminals 314 in the semiconductor circuit 310.

FIG. 9 illustrates an exemplary arrangement of the measurement terminals 314 in the semiconductor circuit 310. The semiconductor circuit 310 typically has the plurality of actual operation terminals 312 formed outside a circuit region 380 where the operation circuit is formed. Referring to FIG. 9, the measurement terminals 314 and the control terminal 316 may be formed in the circuit region 380.

The actual operation terminals 312 may be arranged along sides of the rectangle, whereas the measurement terminals 314 and the control terminal 316 may be formed in an inner area of the rectangle. Alternatively, in the same manner as the actual operation terminals 312, the measurement terminals 314 and the control terminal 316 may be formed outside the circuit region 380. Moreover, the measurement terminals 314 and the control terminal 316 may be formed along sides of the rectangle.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As can be understood from the above description, according to the embodiments of the present invention, it is possible to realize a semiconductor wafer in which a plurality of semiconductor circuits are formed, a substrate for testing the plurality of semiconductor circuits formed on the semiconductor wafer, and a test system thereof.

What is claimed is:

1. A semiconductor wafer in which a plurality of semiconductor circuits are formed, each of the semiconductor circuits comprising:
   an external terminal coupled to an external measurement circuit;
   a plurality of selecting wiring lines provided so as to correspond to a plurality of measuring points in the semiconductor circuit and so as to receive and transmit signals to/from the corresponding measuring points, the selecting wiring lines provided so as to electrically couple the corresponding measuring points to the external terminal;
   a selecting section that selects one of the selecting wiring lines, and that allows signal transmission between the corresponding measuring point and the external terminal through the selected selecting wiring line;
   a measurement driver that is provided between the measuring points and the external terminal;
   an actual operation terminal that is used when the semiconductor circuit is implemented; and
   a driver circuit that outputs a signal outside the semiconductor circuit via the actual operation terminal, wherein output current of the measurement driver is smaller than an output current of the driver circuit.

2. The semiconductor wafer according to claim 1, wherein each of the semiconductor circuits further comprises:
   a switch that switches whether to transmit a signal through a transmission path between the selecting section and the external terminal.

3. The semiconductor wafer according to claim 2, wherein, in each of the semiconductor circuits, the switch is fixed to an off state when the semiconductor circuit is implemented.

4. The semiconductor wafer according to claim 1, wherein, in each of the semiconductor circuits, the external terminal is one of a plurality of external terminals; and
   in each of the semiconductor circuits, the selecting section is one of a plurality of selecting sections.

5. The semiconductor wafer according to claim 1, wherein, in each of the semiconductor circuits, the measurement driver is provided between the selecting section and the external terminal, and outputs a voltage corresponding to a voltage supplied thereto through a selecting wiring line that is selected by the selecting section among the plurality of the selecting wiring lines.

6. The semiconductor wafer according to claim 1, wherein, in each of the semiconductor circuits, the selecting section has a linear transmission property between its output and input.

7. A semiconductor circuit having a plurality of operation circuits, the semiconductor circuit comprising:
   an external terminal coupled to an external measurement circuit;
   a plurality of selecting wiring lines provided so as to correspond to a plurality of measuring points in the semiconductor circuit and so as to receive and transmit signals to/from the corresponding measuring points, the selecting wiring lines provided so as to electrically couple the corresponding measuring points to the external terminal;
   a selecting section that selects one of the selecting wiring lines, and that allows signal transmission between the corresponding measuring point and the external terminal through the selected selecting wiring line;
   a measurement driver that is provided between the measuring points and the external terminal;
   an actual operation terminal that is used when the semiconductor circuit is implemented; and
   a driver circuit that outputs a signal outside the semiconductor circuit via the actual operation terminal; wherein output current of the measurement driver is smaller than an output current of the driver circuit.

8. A test substrate for testing a plurality of semiconductor circuits formed in a semiconductor wafer,
   wherein each of the semiconductor circuits includes:
   an external terminal coupled to an external measurement circuit;
   a plurality of selecting wiring lines provided so as to correspond to a plurality of measuring points in the semiconductor circuit and so as to receive and transmit signals to/from the corresponding measuring points, the selecting wiring lines provided so as to electrically couple the corresponding measuring points to the external terminal;
   a selecting section that selects one of the selecting wiring lines, and that allows signal transmission between the corresponding measuring point and the external terminal through the selected selecting wiring line;
   a measurement driver that is provided between the measuring points and the external terminal;
   an actual operation terminal that is used when the semiconductor circuit is implemented; and
   a driver circuit that outputs a signal outside the semiconductor circuit via the actual operation terminal,
   wherein output current of the measurement driver is smaller than an output current of the driver circuit, and
   wherein the test substrate comprises:
   a measurement circuit that is coupled to the external terminal of one of the semiconductor circuits, and that measures an electrical characteristic of a signal transmitted through the selecting wiring line selected by the selecting section of the one of the semiconductor circuits and the measurement driver of the one of the semiconductor circuits; and
   a control section that controls which one of the selecting wiring lines is to be selected by the selecting section of the one of the semiconductor circuits.

9. A test system for testing a plurality of semiconductor circuits formed in a semiconductor wafer, comprising:
   a test substrate provided so as to transmit and receive signals to/from the semiconductor wafer; and
   a control apparatus to control the test substrate,
   wherein each of the semiconductor circuits includes:
   an external terminal coupled to an external measurement circuit;
   a plurality of selecting wiring lines provided so as to correspond to a plurality of measuring points in the semiconductor circuit and so as to receive and transmit signals to/from the corresponding the measuring points, the selecting wiring lines provided so as to electrically couple the corresponding measuring points to the external terminal;
   a selecting section that selects one of the selecting wiring lines, and that allows signal transmission between the corresponding measuring point and the external terminal through the selected selecting wiring line;
   a measurement driver that is provided between the measuring points and the external terminal;
   an actual operation terminal that is used when the semiconductor circuit is implemented; and
   a driver circuit that outputs a signal outside the semiconductor circuit via the actual operation terminal, wherein output current of the measurement driver is smaller than an output current of the driver circuit, and wherein the test substrate includes:

a measurement circuit that is coupled to the external terminal of one of the semiconductor circuits, and that measures an electrical characteristic of a signal transmitted through the selecting wiring line selected by the selecting section of the one of the semiconductor circuits and the measurement driver of the one of the semiconductor circuits; and a control section that controls which one of the selecting wiring lines is to be selected by the selecting section of the one of the semiconductor circuits.

* * * * *